US012605941B2

(12) United States Patent
Kim et al.

(10) Patent No.: US 12,605,941 B2
(45) Date of Patent: Apr. 21, 2026

(54) COATING METHOD AND COATING APPARATUS

(71) Applicant: SAMSUNG DISPLAY CO., LTD., Yongin-si (KR)

(72) Inventors: Doohyun Kim, Yongin-si (KR); Yejin Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 76 days.

(21) Appl. No.: 18/314,458

(22) Filed: May 9, 2023

(65) Prior Publication Data

US 2024/0100860 A1 Mar. 28, 2024

(30) Foreign Application Priority Data

Sep. 22, 2022 (KR) ........................ 10-2022-0119840

(51) Int. Cl.
B41J 3/407 (2006.01)
B41J 2/145 (2006.01)
H10K 71/13 (2023.01)

(52) U.S. Cl.
CPC ............... B41J 3/407 (2013.01); B41J 2/145 (2013.01); H10K 71/135 (2023.02)

(58) Field of Classification Search
None
See application file for complete search history.

(56) References Cited

U.S. PATENT DOCUMENTS

| | | | | |
|---|---|---|---|---|
| 11,001,687 | B2 * | 5/2021 | Yamauchi | .............. H10K 50/00 |
| 2019/0194409 | A1 * | 6/2019 | Yamauchi | .............. H05K 1/097 |
| 2019/0330482 | A1 * | 10/2019 | Williams | ............. H10D 62/882 |

FOREIGN PATENT DOCUMENTS

| | | |
|---|---|---|
| KR | 10-2019-0120851 | 10/2019 |
| KR | 10-2188938 | 12/2020 |

OTHER PUBLICATIONS

"Practice Drawing Lines at Any Angle". YouTube video. <<https://www.youtube.com/watch?v=FIjFqK71WOE>> (uploaded on Jun. 18, 2021, last viewed Feb. 6, 2025). (Year: 2021).*
Ms. Cooper's Art Class. "How to Draw Using Dots (Stippling Tutorial)—for Beginners". YouTube video. <<https://www.youtube.com/watch?v=vFqNSEsQzhk>> (uploaded on Sep. 25, 2019, last viewed Feb. 6, 2025). (Year: 2019).*

* cited by examiner

*Primary Examiner* — Alexander M Weddle
(74) *Attorney, Agent, or Firm* — F. CHAU & ASSOCIATES, LLC

(57) ABSTRACT

A coating method includes applying a first ink on a print object, rotating the print object to a substantially perpendicular position, and applying a second ink on the first ink on the print object.

20 Claims, 7 Drawing Sheets

PO:PNL

11

P0

ST

IH1 IH1
IA1

CM1

IH2

IA2

CM2

DR2

DR1

PNL

ST

IH1 IH1
IA1

CM1

P0:PNL

COATING METHOD AND COATING APPARATUS

CROSS-REFERENCE TO RELATED APPLICATION(S)

This application claims priority under 35 USC § 119 to Korean Patent Application No. 10-2022-0119840, filed on Sep. 22, 2022, in the Korean Intellectual Property Office (KIPO), the disclosure of which is hereby incorporated by reference in its entirety.

TECHNICAL FIELD

Embodiments of the present inventive concept relate to a coating method. More particularly, embodiments of the present inventive concept relate to an ink coating method and a coating apparatus for performing the same.

DISCUSSION OF RELATED ART

A display device is a device that displays an image to provide visual information to a user. Among display devices, an organic light emitting diode display (OLED display) has recently been attracting attention.

When a display device is manufactured by an inkjet process, an edge profile may not be uniform. Profiles may be different for each coating direction. Therefore, print quality may be degraded in the inkjet process.

SUMMARY

Embodiments provide a coating method with improved print quality.

Embodiments provide a coating apparatus performing the coating method.

A coating method according to an embodiment may include applying a first ink on a print object, rotating the print object to a substantially perpendicular position, and applying a second ink on the first ink on the print object.

In an embodiment, the applying of the second ink on the first ink on the print object may include applying the second ink on the first ink at an edge of the print object.

In an embodiment, the rotating of the print object to the substantially perpendicular position may be performed after the applying of the first ink on the print object.

In an embodiment, the first ink and the second ink may include a same material.

In an embodiment, each of the first ink and the second ink may include an optically clear resin.

In an embodiment, the first ink and the second ink may be applied as a plurality of dots.

In an embodiment, after applying the first ink on the print object, the coating method may further include curing the first ink applied on the print object.

In an embodiment, after applying the second ink on the print object, the coating method may further include curing the second ink applied on the print object.

A coating method according to an embodiment may include applying a first ink on the print object as the print object is moved in a first direction and applying a second ink on the first ink at an edge of the print object.

In an embodiment, the first ink and the second ink may be applied as a plurality of dots along the edge of the print object.

In an embodiment, the first ink and the second ink may include a same material.

In an embodiment, each of the first ink and the second ink may include an optically clear resin.

In an embodiment, the first ink and the second ink may be applied as a plurality of dots.

In an embodiment, after applying the first ink on the print object, the coating method may further include curing the first ink applied on the print object.

In an embodiment, after applying the second ink on the first ink at the edge of the print object, the coating method may further include curing the second ink applied on the edge of the print object.

A coating apparatus according to an embodiment may include a stage configured to move a print object, a plurality of first inkjet heads configured to apply a first ink on the print object, including at an edge of the print object, and a second inkjet head configured to apply a second ink while moving and rotating along the edge of the print object.

In an embodiment, the second inkjet head may include one second inkjet head, and the second inkjet head may be configured to apply the second ink on the first ink at the edge of the print object.

In an embodiment, the stage may be configured to move the print object in a first direction relative to the first inkjet heads.

In an embodiment, the stage may be configured to have a fixed position while the second inkjet head applies the second ink.

In an embodiment, the coating apparatus may further include a first curing member curing the first ink and a second curing member curing the second ink.

In the coating method according to the present disclosure, after the first coating process, the display panel may be rotated, and ink may be applied on the edge of the display panel through a second coating process, so that a linearity of the ink applied on the display panel in each of the first direction and the second direction may be ensured. Also, the profiles of the ink applied on the display panel in the first direction and in the second direction may be constant. Thus, print quality may be improved.

Also, the linearity and profile of the ink applied on the display panel in the first direction and the second direction may be improved without adding to a number of inkjet heads included in the inkjet apparatus. Thus, costs may be reduced, and process efficiency may be improved.

BRIEF DESCRIPTION OF THE DRAWINGS

Illustrative, non-limiting embodiments will be more clearly understood from the following detailed description in conjunction with the accompanying drawings.

FIG. 12 is a plan view illustrating a second ink applied on a print object after the second coating process of FIG. 11 is performed.

DETAILED DESCRIPTION

Figure 1:
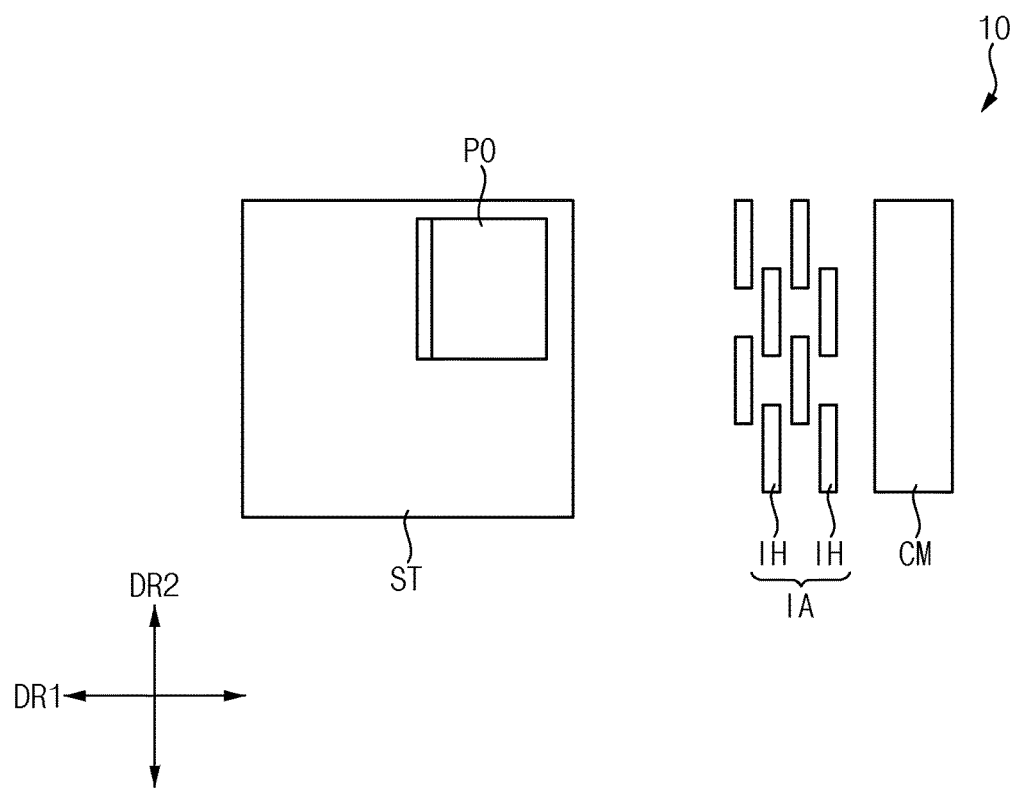
FIG. 1 is a plan view illustrating a coating apparatus for performing a coating method according to embodiments of the present disclosure.

Hereinafter, display devices in accordance with embodiments will be described in more detail with reference to the accompanying drawings. The same reference numerals are used for the same components in the drawings, and redundant descriptions of the same components may be omitted.

FIG. 1 is a plan view illustrating a coating apparatus for performing a coating method according to an embodiment of the present disclosure.

Referring to FIG. 1, a coating apparatus 10 may include a stage ST, an inkjet apparatus IA, and a curing member CM.

A print object PO may be disposed on the stage ST. The stage ST may move or rotate the print object PO. For example, the stage ST may move the print object PO in a first direction DR1 or rotate the print object PO in a plain defined by the first direction DR1 and a second direction DR2. The first direction DR1 may be a direction in which ink is applied to the print object PO.

The inkjet apparatus IA may apply ink on the print object PO. The inkjet apparatus IA may include a plurality of inkjet heads IH. Each of the inkjet heads IH may include one or more nozzles. Each of the nozzles may apply an ink. The applied ink may be applied on the print object PO. The ink may be a photocurable resin, for example. Other inks may be used, and the present disclosure is not limited to examples described herein.

The curing member CM may cure the applied ink. For example, the curing member CM may cure the applied ink by irradiating UV light. Since the curing member CM cures the applied ink, a shape of the applied ink may be maintained.

FIGS. 2 to 7 are views illustrating a coating method according to an embodiment of the present disclosure.

For example, a coating method described with reference to FIGS. 2 to 7 may be a coating method using the coating apparatus 10 of FIG. 1.

Figure 2:
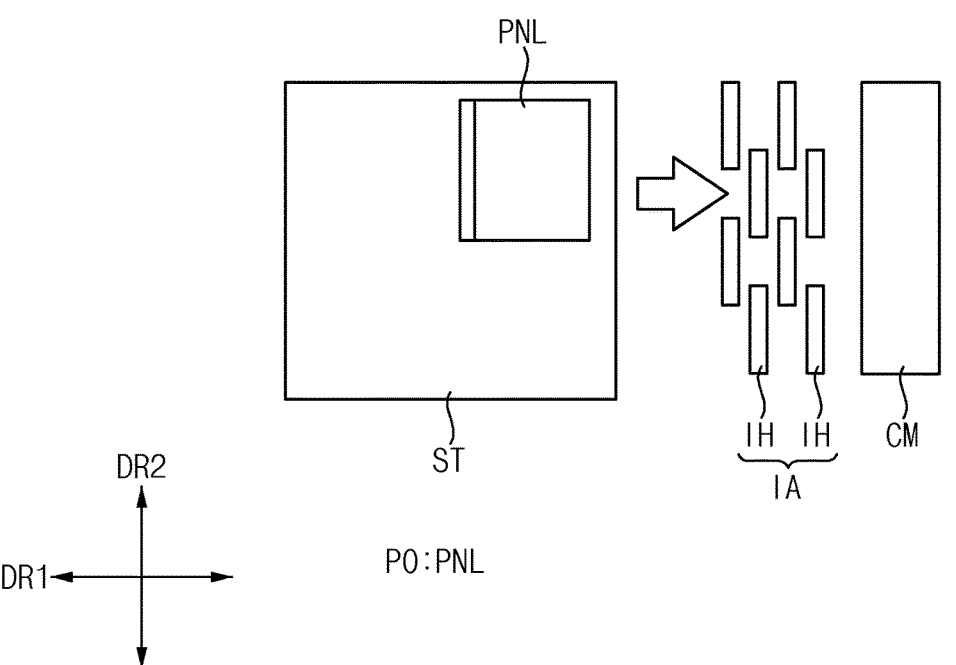
FIG. 2 is a view illustrating a first coating process.
Figure 3:
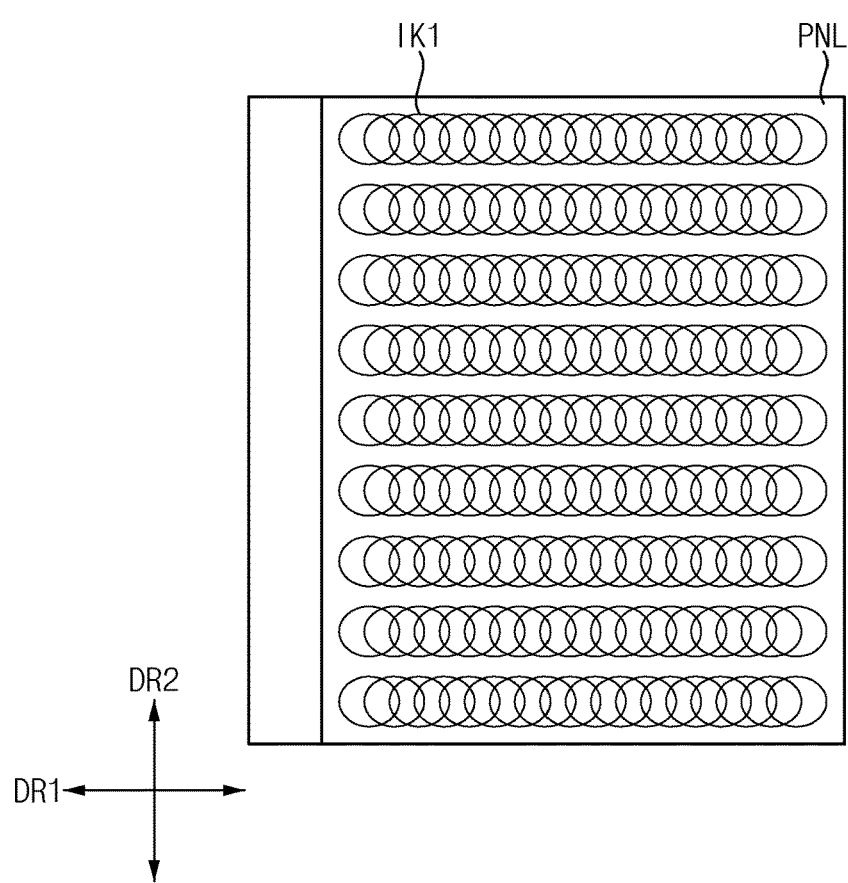
FIG. 3 is a plan view illustrating a print object coated with a first ink after the first coating process of FIG. 2 is performed.

FIG. 2 is a view illustrating a first coating process in accordance with some embodiments of the present disclosure. FIG. 3 is a plan view illustrating a print object coated with a first ink after the first coating process of FIG. 2 is performed.

Referring to FIG. 2, a first coating process and a second coating process may be sequentially performed on the print object PO. Also, the print object PO may be a display panel PNL. However, the present disclosure is not limited thereto, and the print object PO may be an object on which ink is applied. Hereinafter, embodiments of the first coating process will be described.

The stage ST may move the display panel PNL in the first direction DR1. That is, by moving the stage ST, the stage ST may be moved into a position where an ink may be applied by the inkjet apparatus IA. For example, the stage ST may move the display panel PNL under the inkjet apparatus IA. In some cases, the inkjet apparatus IA and the curing member CM may be fixed in place. However, embodiments of the present disclosure is not limited thereto. For example, the stage ST may be fixed in place, and the inkjet apparatus IA and the curing member CM may move.

When the display panel PNL moves into a position where an ink may be applied by the inkjet apparatus IA, the inkjet apparatus IA may apply a first ink on the display panel PNL in the first direction DR1.

After the first ink is applied on the display panel PNL, the first ink applied on the display panel PNL may be cured. The curing member CM may cure the first ink through exposure to ultraviolet light, for example.

Referring to FIG. 3, the first ink IK1 may be applied on the display panel PNL. For example, the first ink IK1 may be applied as a plurality of dots or droplets. A gap between dots of the first ink IK1 applied on the display panel PNL in the first direction DR1 may be relatively narrow. A gap between dots of the first ink IK1 applied on the display panel PNL in the second direction DR2 may be relatively wide. The second direction DR2 may be orthogonal to the first direction DR1.

A measure of the gap may be related to the dots per inch (DPI). The DPI may mean a number of ink dots per inch. For example, DPI of the first ink IK1 in the first direction DR1 may be 1980 DPI, and DPI of the first ink IK1 in the second direction DR2 may be 720 DPI. That is, the gap between the first ink IK1 in the second direction DR2 may be greater than the gap between the first ink IK1 in the first direction DR1. For example, the gap between the first ink IK1 in the second direction DR2 may be at least two times greater than the gap between the first ink IK1 in the first direction DR1. Stated another way, a density of the dots applied in the first direction DR1 may be at least twice a density the dots applied in the second direction DR2.

In an embodiment, a linearity of the first ink IK1 applied on an edge of the display panel PNL in the first direction DR1 may be relatively high. On the other hand, a linearity of the first ink IK1 applied on an edge of the display panel PNL in the second direction DR2 may be relatively low. For example, there may be gaps between rows of dots of the first ink IK1 applied in the first direction DR1.

Also, a profile of the first ink IK1 applied on the edge of the display panel PNL in the first direction DR1 may be constant. On the other hand, a profile of the first ink IK1 applied on the edge of the display panel PNL in the second direction DR2 may not be constant.

Figure 4:
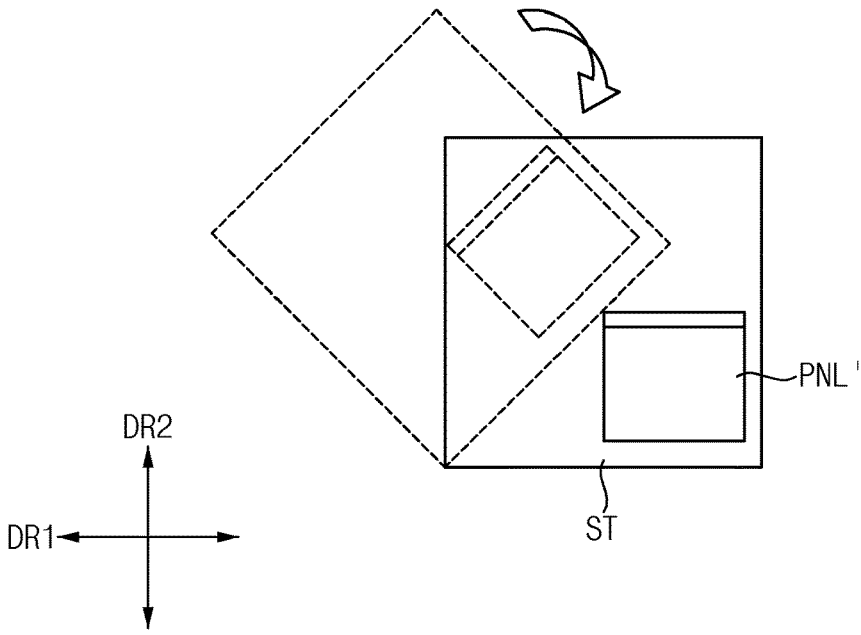
FIG. 4 is a view illustrating a step of rotating the print object after the first coating process and before a second coating process.
Figure 5:
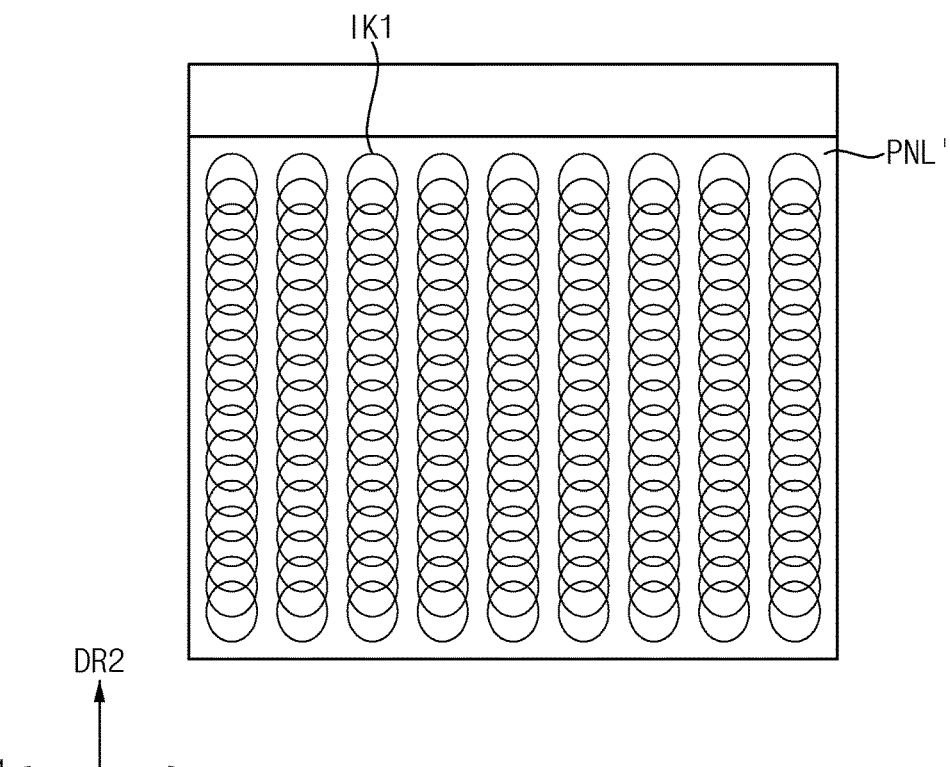
FIG. 5 is a plan view illustrating a state in which the print object of FIG. 3 is rotated.

FIG. 4 is a view illustrating a step of rotating the display panel PNL after the first coating process and before a second coating process. FIG. 5 is a plan view illustrating a state in which the print object of FIG. 3 is rotated. Note that embodiments are not limited to the display panel PNL and any print object PO may be used.

Referring to FIG. 4, the display panel PNL may be rotated by about 90 degrees in a clockwise direction. That is, the stage ST may rotate the display panel PNL by about 90 degrees. More particularly, the display panel PNL may be rotated by 90 degrees. However, embodiments of the present disclosure are not limited thereto, and the display panel PNL and the stage ST may rotate in a counterclockwise direction. In another example, the display panel PNL may be rotated by about 270 degrees in the clockwise direction of the counterclockwise direction. State another way, the display panel PNL may be rotated in a plain defined by the first direction DR1 and the second direction DR2 from an initial position to a substantially perpendicular position that is substantially perpendicular to the initial position.

In an embodiment, the display panel PNL may be rotated after the first coating process is performed.

Referring to FIG. 5, the display panel PNL of FIG. 3 has been rotated by about 90 degrees, and a rotated display panel PNL' is illustrated. On the rotated display panel PNL', a gap between dots of the first ink IK1 in the second direction DR2 may be relatively narrow. In addition, a gap between dots of the first ink IK1 in the first direction DR1 may be relatively wide. That is, compared to a state before rotation (e.g., the display panel PNL of FIG. 3), after rotation, the gap between the first ink IK1 in the first direction DR1 and the gap between the first ink IK1 in the second direction DR2 may be interchanged.

Figure 6:
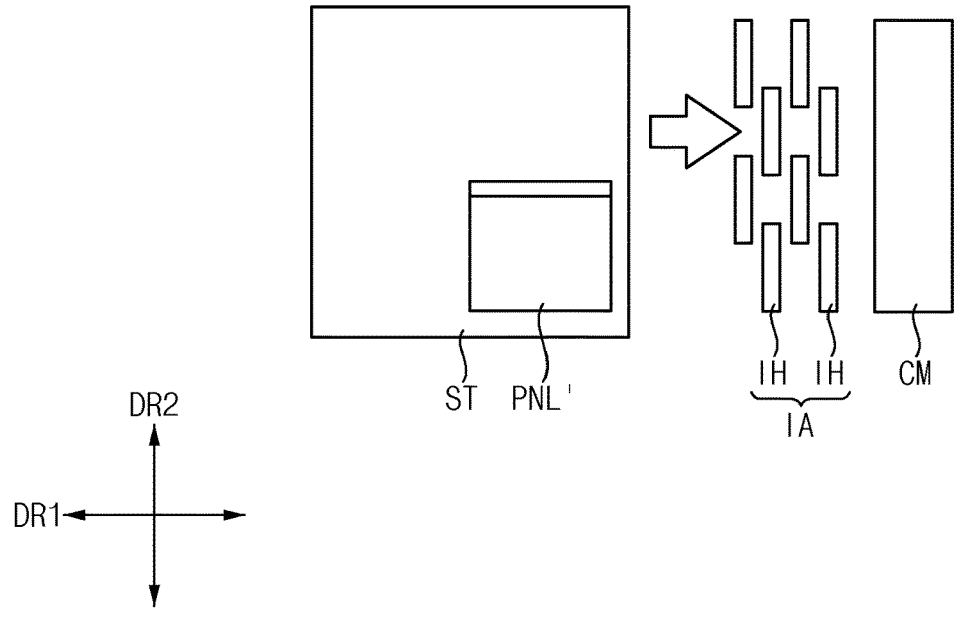
FIG. 6 is a view illustrating a second coating process.
Figure 7:
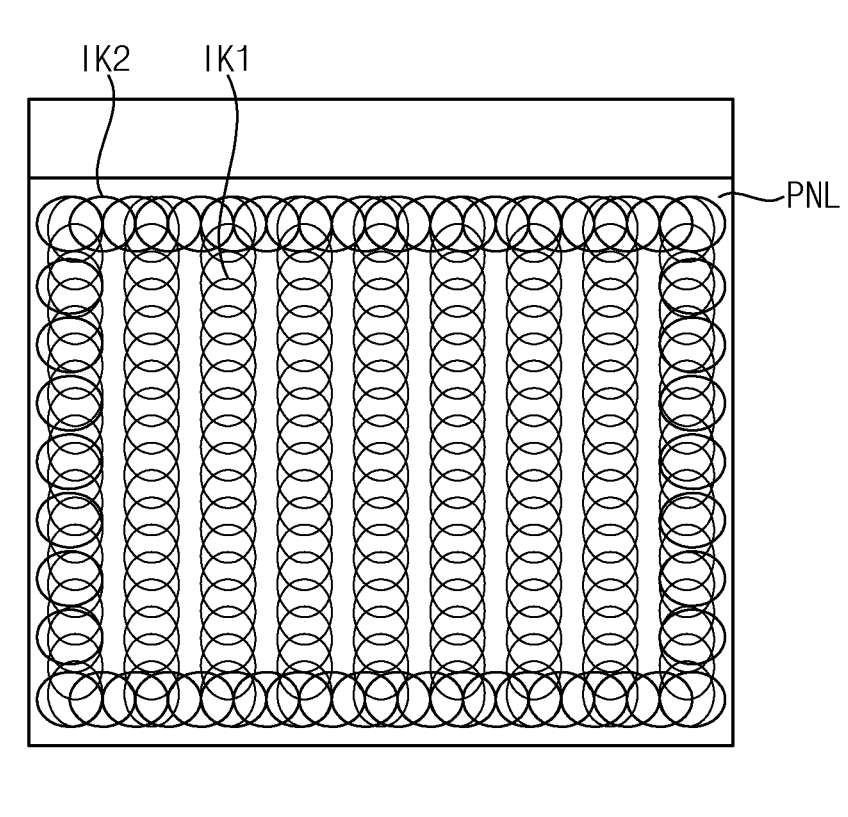
FIG. 7 is a plan view illustrating a print object coated with a second ink after the second coating process of FIG. 6 is performed.
Figure 7:
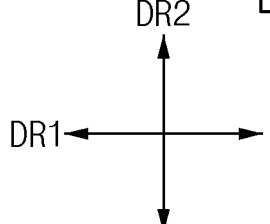

FIG. 6 is a view illustrating a second coating process in accordance with some embodiments of the present disclosure. FIG. 7 is a plan view illustrating the rotated display panel PNL' coated with a second ink after the second coating process of FIG. 6 is performed.

Referring to FIG. 6, the stage ST may move the rotated display panel PNL' in the first direction DR1. That is, by moving the stage ST, the stage ST may be moved into a position where an ink may be applied by the inkjet apparatus IA. For example, the stage ST may move the rotated display panel PNL' below the inkjet apparatus IA again. In this case, the inkjet apparatus IA and the curing member CM may be fixed in place.

When the rotated display panel PNL' is moved into a position where an ink may be applied by the inkjet apparatus IA, the inkjet apparatus IA may apply a second ink in the first direction DR1 on the rotated display panel PNL'.

The second ink may include the same material as the first ink. For example, each of the first ink and the second ink may include an optically clear resin (OCR). In some embodiments, the first ink and the second ink may be different materials.

The second ink may be applied on an edge of the rotated display panel PNL'. However, the present disclosure is not limited thereto, and the second ink may be entirely applied on the rotated display panel PNL'. For example, in FIG. 7, nine rows of the second ink are illustrated in the second direction DR2, and a top and a bottom row are entirely applied, while the middle rows include applied second ink only at leftmost and rightmost columns in the first direction DR1. However, the middle rows may also be entirely applied on the rotated display panel PNL' in the first direction DR1.

After the second ink is applied on the rotated display panel PNL', the second ink applied on the rotated display panel PNL' may be cured. The curing member CM may cure the second ink through exposure to ultraviolet light.

Further referring to FIG. 7, the second ink IK2 may be applied on one or more edges of the rotated display panel PNL'. In some embodiments, with the first ink IK1 and the second ink IK2 applied of the rotated display panel PNL', the gaps between dots of the ink in the first direction DR1 and the gaps between dots of the ink in the second direction DR2 may be substantially the same at the edges of the rotated display panel PNL'.

As illustrated, similar to the first coating process, the dots of the second ink IK2 may have a relatively narrow gap in the first direction DR1 in the second coating process. Since dots of the second ink IK2 are formed at the edge of the rotated display panel PNL' at the relatively narrow gap in the first direction DR1, the gap between dots of the ink applied at the edge of the rotated display panel PNL' in the first direction DR1 and the gap between dots of the ink in the second direction DR2 may be substantially the same. Stated another way, a density of dots of the ink applied at the edge of the rotated display panel PNL' in the first direction DR1 and a density of dots of the ink in the second direction DR2 may be substantially the same as a result of the application of the first ink IK1 and the second ink IK2.

Accordingly, the relatively wide gap between rows of dots of the first ink IK1 applied in the first direction DR1 (see FIG. 3) before the second coating process may be narrowed due to the second coating process. Stated another way, a relatively low density between rows of dots of the first ink IK1 applied in the first direction DR1 (see FIG. 3) before the second coating process may be increased due to the second coating process.

Accordingly, a linearity of the first ink IK1 and the second ink IK2 applied on the edge of the rotated display panel PNL' in the second direction DR2, and a linearity of the first ink IK1 and the second ink IK2 applied on the edge of the rotated display panel PNL' in the first direction DR1 may also be improved. For example, gaps between dots of the ink may be filled or eliminated.

In addition, a profile of the first ink IK1 and the second ink IK2 applied on the edge of the rotated display panel PNL' in the second direction DR2, and a profile of the first ink IK1 and the second ink IK2 applied on the edge of the rotated display panel PNL' in the first direction DR1 may be improved.

In an embodiment, after the first coating process, the display panel PNL is rotated, and the ink is applied at least to the edge of the rotated display panel PNL' through the second coating process, so that the linearity of the ink applied on the display panel PNL in the first direction DR1 and the second direction DR2 may be improved. For example, gaps between dots of the ink may be substantially the same in the first direction DR1 and the second direction DR2. For example, gaps between dots of the ink may be substantially the same filled or eliminated around the edge of the rotated display panel PNL'. More generally, a density of dots applied at the edges of the rotated display panel PNL' may be increased. Also, the profile of the ink applied on the display panel PNL in the first direction DR1 and the second direction DR2 may be constant. Thus, a print quality may be improved.

Also, without adding to a number of inkjet heads IH included in the inkjet apparatus IA, the linearity and the profile of the ink applied on the display panel PNL in the first direction DR1 and the second direction DR2 may be improved. Thus, costs may be reduced and process efficiency may be improved.

Figure 8:
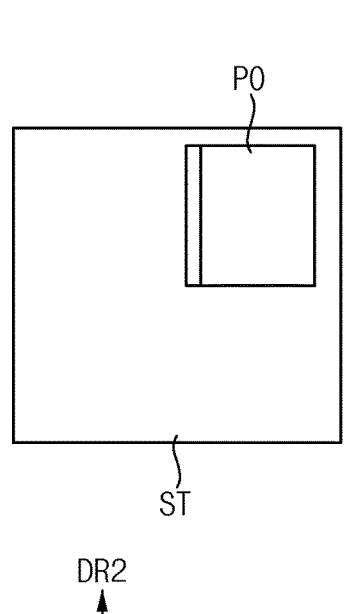
FIG. 8 is a plan view illustrating a coating apparatus according to embodiments of the present disclosure.
Figure 8:
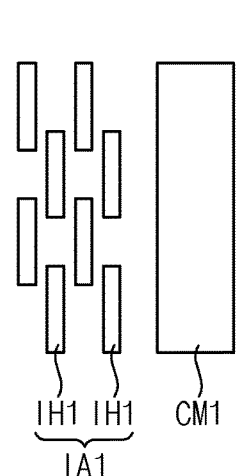
Figure 8:
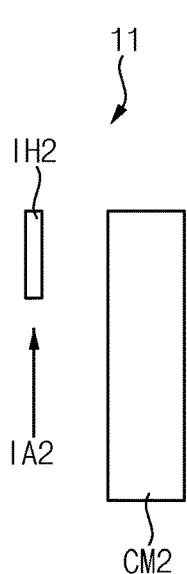
Figure 8:
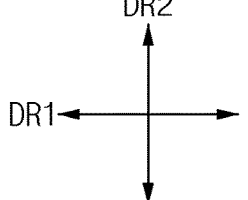

FIG. 8 is a plan view illustrating a coating apparatus according to an embodiment of the present disclosure.

Referring to FIG. 8, a coating apparatus 11 may include a stage ST, a first inkjet apparatus IA1, a first curing member CM1, a second inkjet apparatus IA2, and a second curing member CM2.

A print object PO may be disposed on the stage ST. The stage ST may move the print object PO or may be fixed in place. For example, the stage ST may move the print object PO in a first direction DR1. The first direction DR1 may be a direction in which ink is applied to the print object PO.

For example, the stage ST may move the print object PO in the first direction DR1 into a position where an ink may be applied by the first inkjet heads IH1. However, embodiments of the present disclosure are not limited thereto.

A first coating process and a second coating process may be sequentially performed on the print object PO.

The first inkjet apparatus IA1 and the first curing member CM1 may be used in the first coating process. The second inkjet apparatus IA2 and the second curing member CM2 may be used in the second coating process. However, embodiments of the present disclosure are not limited thereto, and the second inkjet apparatus IA2 may be a part of the first inkjet apparatus IA1, and the first curing member CM1 may be used in the second coating process. For example, the second curing member CM2 may be omitted.

The first inkjet apparatus IA1 may apply a first ink on the print object PO. The first inkjet apparatus IA1 may include a plurality of first inkjet heads IH1. Each of the first inkjet heads IH1 may include one or more nozzles. Each of the nozzles may apply the first ink. The applied first ink may be applied on the print object PO.

The first curing member CM1 may cure the applied first ink. The first curing member CM1 may irradiate the applied first ink with ultraviolet light to cure the first ink. Since the first curing member CM1 cures the first ink, a shape of the first ink may be maintained.

The second inkjet apparatus IA2 may apply a second ink on the print object PO. The second inkjet apparatus IA2 may include a second inkjet head IH2. However, embodiments of the present disclosure are not limited thereto. For example, the second inkjet apparatus IA2 may include one or more second inkjet heads IH2

The second inkjet head IH2 may move and rotate along an edge of the object PO. That is, the second inkjet head IH2 may apply the second ink IK2 along the edge of the object PO. For example, the stage ST may be in a fixed position while the second ink IK2 is applied by the second inkjet head IH2.

The second curing member CM2 may cure the applied second ink. The second curing member CM2 may cure the second ink by irradiating the applied second ink with ultraviolet light. As the second curing member CM2 cures the second ink, a shape of the second ink may be maintained.

Hereinafter, embodiments of the first coating process will be described.

FIGS. 9 to 12 are views illustrating a coating method according to another embodiment of the present disclosure.

For example, a coating method described with reference to FIGS. 9 to 12 may be a coating method using the coating apparatus 11 of FIG. 8.

Figure 9:
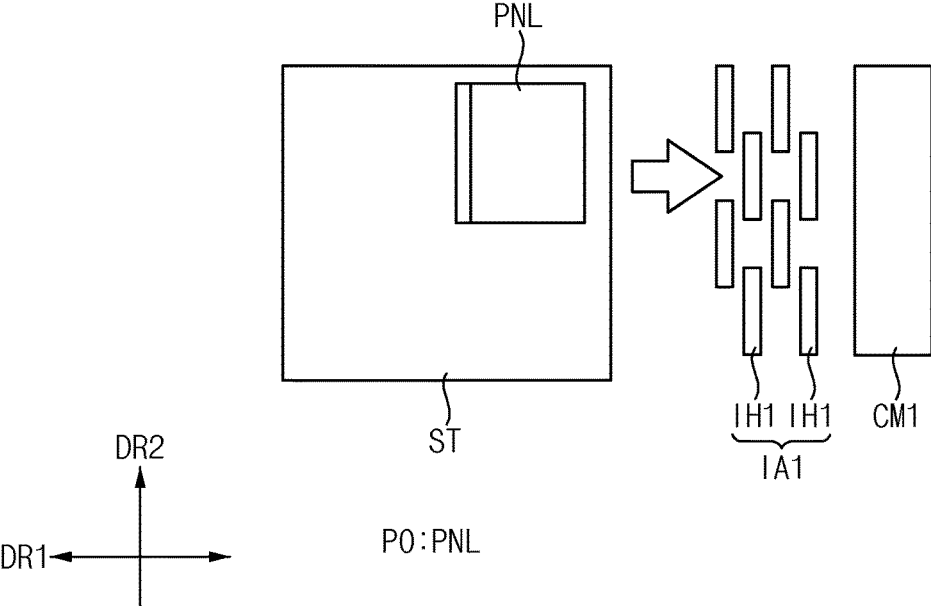
FIG. 9 is a view illustrating a first coating process.
Figure 10:
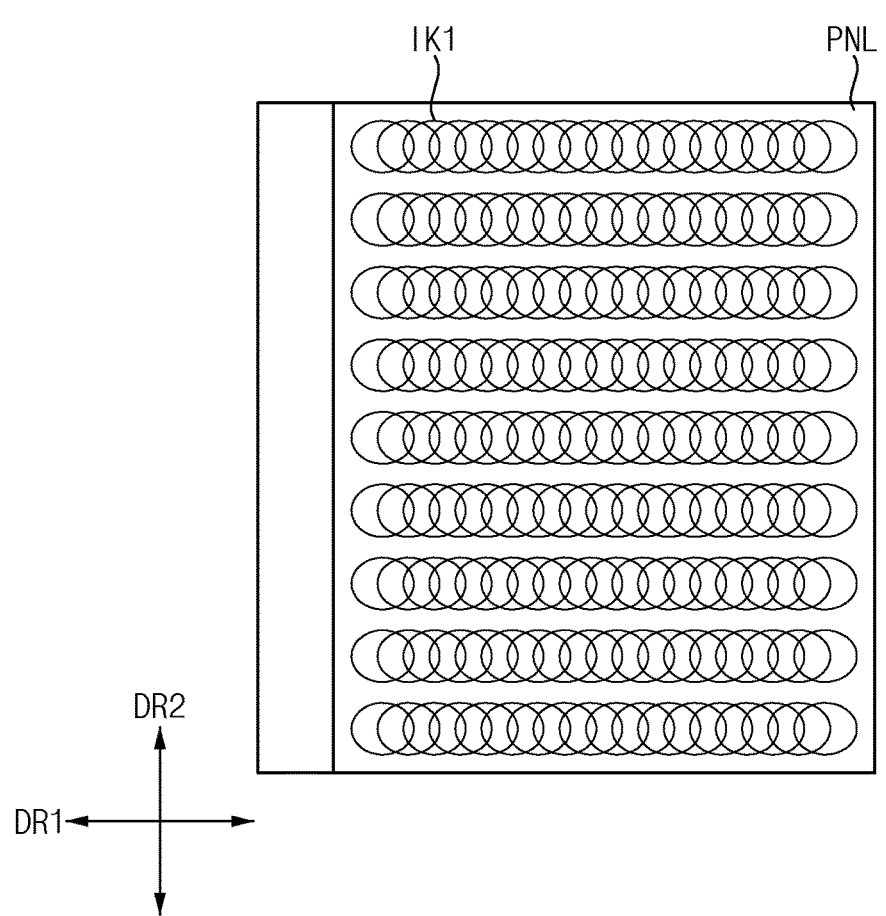
FIG. 10 is a plan view illustrating a first ink applied on the print object after the first coating process of FIG. 9 is performed.

FIG. 9 is a view illustrating a first coating process. FIG. 10 is a plan view illustrating a first ink applied on the print object after the first coating process of FIG. 9 is performed.

Referring to FIG. 9, a print object PO may be a display panel PNL. However, other print objects are contemplated and embodiments of the present disclosure are not limited thereto.

The stage ST may move the display panel PNL in the first direction DR1. That is, the stage ST may move the display panel PNL to a position where an ink may be applied by the first inkjet apparatus IA1. In this case, the first inkjet apparatus IA1 and the first curing member CM1 may be fixed. However, embodiments of the present disclosure are not limited thereto, and the stage ST may be fixed in position, and the first inkjet apparatus IA1 and the first curing member CM1 may move.

When the display panel PNL moves to a position where an ink may be applied by the first inkjet apparatus IA1, the first inkjet apparatus IA1 may apply the first ink IK1 on the display panel PNL in the first direction DR1.

After the first ink IK1 is applied on the display panel PNL, the first ink IK1 applied on the display panel PNL may be cured. The first curing member CM1 may cure the first ink IK1 through exposure to ultraviolet light.

Further referring to FIG. 10, the first ink IK1 may be applied on the display panel PNL. A gap between dots of the first ink IK1 applied on the display panel PNL in the first direction DR1 may be relatively narrow. A gap between dots of the first ink IK1 applied on the display panel PNL in the second direction DR2 may be relatively wide.

Accordingly, a linearity of the first ink IK1 applied on the edge of the display panel PNL in the first direction DR1 may be relatively high. On the other hand, a linearity of the first ink IK1 applied on the edge of the display panel PNL in the second direction DR2 may be relatively low. For example, there may be gaps between rows of dots of the first ink IK1 applied in the first direction DR1.

Also, a profile of the first ink IK1 applied on the edge of the display panel PNL in the first direction DR1 may be constant. On the other hand, a profile of the first ink IK1 applied on the edge of the display panel PNL in the second direction DR2 may not be constant.

Figure 11:
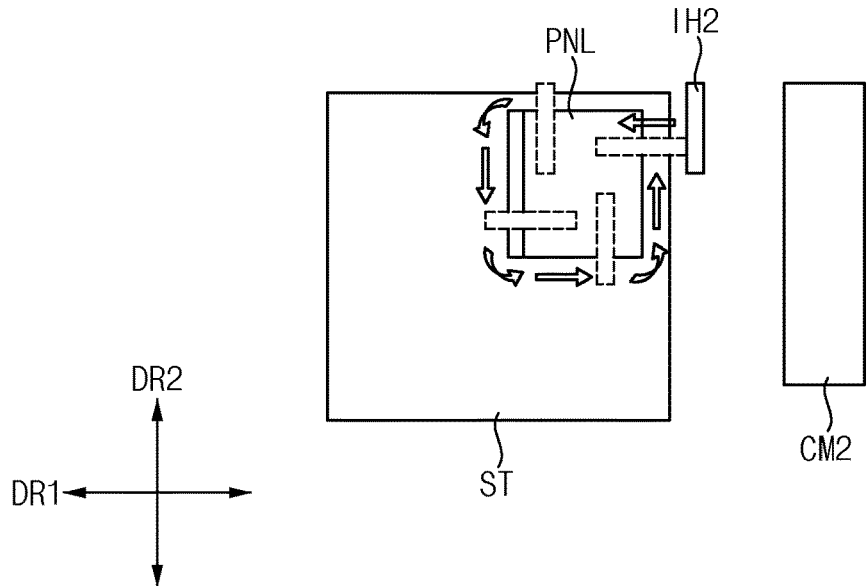
FIG. 11 is a view illustrating a second coating process.

FIG. 11 is a view illustrating a second coating process according to embodiments of the present disclosure.

Figure 12:
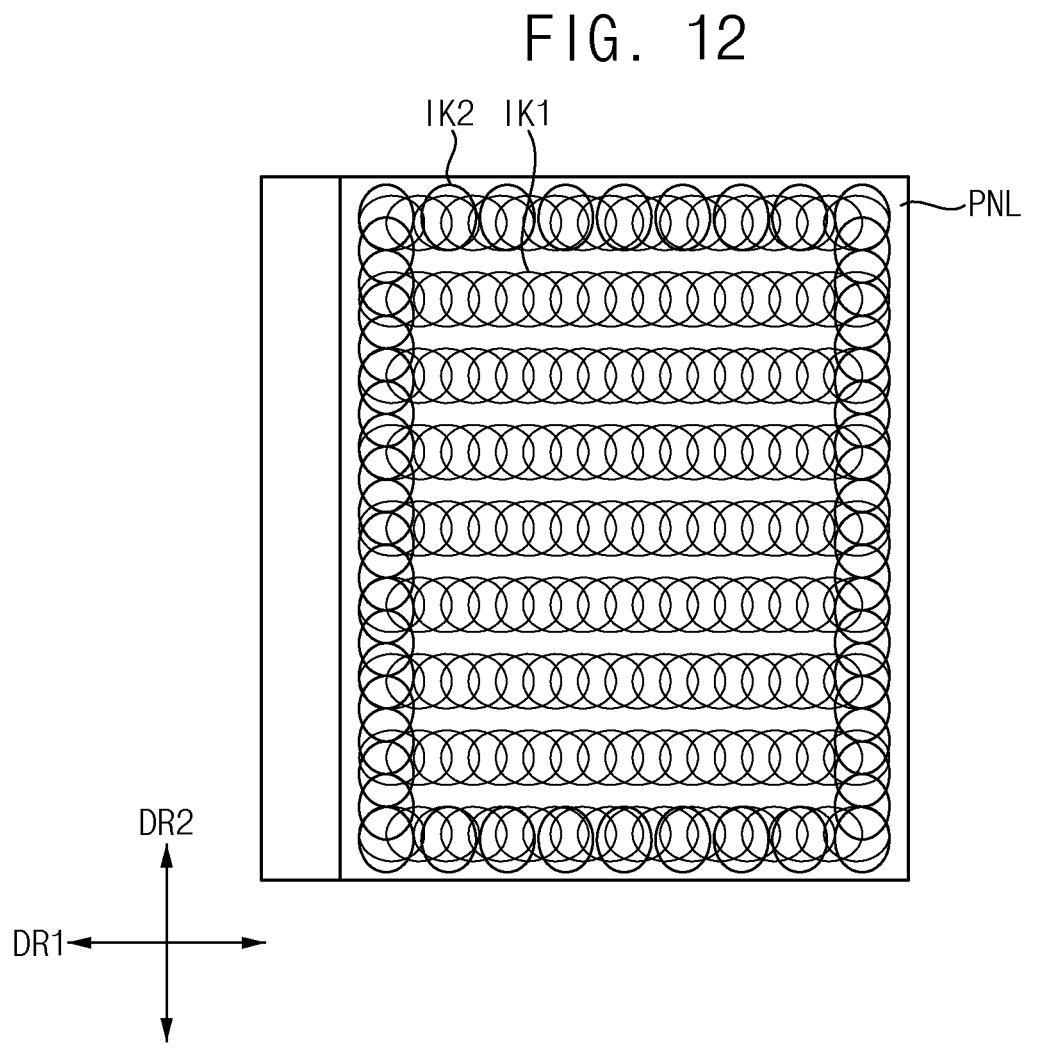

FIG. 12 is a plan view illustrating a second ink applied on a display panel PNL after the second coating process of FIG. 11 is performed.

Referring to FIG. 11, the stage ST may move the display panel PNL relative to the second inkjet apparatus IA2. However, the present disclosure is not limited thereto, and the second inkjet apparatus IA2 may move relative to the stage ST. In this case, the second inkjet head IH2 of the second inkjet apparatus IA2 may move, and the curing member CM may be fixed in position.

The second inkjet head IH2 may move and rotate relative to the display panel PNL, for example, along an edge of the display panel PNL. The second inkjet head IH2 may apply the second ink to the display panel PNL. More particularly, the second inkjet head IH2 may apply the second ink to an edge of the display panel PNL. Accordingly, the second ink may be applied along the edge of the print object PO. However, embodiments of the present disclosure are not limited thereto. For example, the second ink may be applied on other portions of the display panel PNL or an entirety of the display panel PNL.

The second ink may include the same material as the first ink. For example, each of the first ink and the second ink may include an optically clear resin (OCR). In some embodiments, the first ink and the second ink may be different materials.

After the second ink is applied on the display panel, the second ink applied on the display panel PNL may be cured. The second curing member CM2 may cure the second ink through exposure to ultraviolet light.

Referring further to FIG. 12, the second ink IK2 may be applied to one or more edges of the display panel PNL. In some embodiments, with the first ink IK1 and the second ink IK2 applied of the rotated display panel PNL', the gaps between dots of the ink in the first direction DR1 and the gaps between dots of the ink in the second direction DR2 may be substantially the same at the edges of the display panel PNL.

As illustrated, due to the second coating process, the gap between the dots of the second ink IK2 in the second direction DR2 may also be formed to be relatively narrow. Since dots of the second ink IK2 are formed at the edge of the display panel PNL at the relatively narrow gap in the second direction DR2, the gap between dots of the ink applied at the edge of the display panel PNL in the first direction DR1 and the gap between dots of the ink in the second direction DR2 may be substantially the same. Stated another way, a density of dots of the ink applied at the edge of the display panel PNL in the first direction DR1 and a density of dots of the ink in the second direction DR2 may be substantially the same as a result of the application of the first ink IK1 and the second ink IK2.

Accordingly, the relatively wide gap between rows of dots of the first ink IK1 applied in the first direction DR1 (see FIG. 10) before the second coating process may be narrowed due to the second coating process.

Accordingly, a linearity of the first ink IK1 and the second ink IK2 applied on the edge of the display panel PNL in the first direction DR1, and a linearity of the first ink IK1 and the second ink IK2 applied on the edge of the display panel PNL in the second direction DR2 may also be improved. For example, gaps between dots of the ink may be filled or eliminated.

In addition, a profile of the first ink IK1 and the second ink IK2 applied on the edge of the display panel PNL in the first direction DR1, and a profile of the first ink IK1 and the second ink IK2 applied on the edge of the display panel PNL in the second direction DR2 may be improved.

In an embodiment, after the first coating process, the ink is applied to the edge of the display panel PNL through the second coating process in which the second inkjet apparatus IA2 moves and rotates, so that the linearity of the ink applied on the display panel PNL in the first direction DR1 and the second direction DR2 may be improved. For example, gaps between dots of the ink may be substantially the same in the first direction DR1 and the second direction DR2. For example, gaps between dots of the ink may be substantially the same filled or eliminated around the edge of the display panel PNL. More generally, a density of dots applied at the edges of the display panel PNL may be increased. Also, the profile of the ink applied on the display panel PNL in the first direction DR1 and the second direction DR2 may be constant. Thus, print quality may be improved.

In addition, in the second coating process, in an embodiment in which one second inkjet head IH2 applies the ink, a cost may be reduced and process efficiency may be improved.

The methods and the apparatuses according to embodiments of the present disclosure may be applied to a print object such as a display device included in a computer, a notebook, a mobile phone, a smartphone, a smart pad, a PMP, a PDA, an MP3 player, or the like.

Although the methods and the apparatuses according to embodiments of the present disclosure have been described with reference to the drawings, illustrated embodiments are examples, and may be modified and changed by a person having ordinary knowledge in the relevant technical field without departing from the technical spirit described in the following claims.

What is claimed is:

1. A coating method comprising:
applying a first ink on a print object, wherein the print object is a display panel;
rotating the display panel to a substantially perpendicular position; and
applying a second ink on the first ink on the display panel,
wherein each of the first ink and the second ink includes an optically clear resin.

2. The coating method of claim 1, wherein the applying of the second ink on the first ink on the display panel includes applying the second ink on the first ink at an edge of the display panel.

3. The coating method of claim 1, wherein the rotating of the display panel to the substantially perpendicular position is performed after the applying of the first ink on the display panel.

4. The coating method of claim 1, wherein the first ink and the second ink include a same material.

5. The coating method of claim 1, wherein the first ink and the second ink are applied as a plurality of dots.

6. The coating method of claim 1, further comprising:
curing the first ink applied on the display panel after applying the first ink on the display panel.

7. The coating method of claim 1, further comprising:
curing the second ink applied on the display panel after applying the second ink on the display panel.

8. A coating method comprising:
providing a print object on a stage, wherein the print object is a display panel;
applying, by an inkjet apparatus, a first ink on the display panel;
rotating, by the stage, the display panel to a substantially perpendicular position; and
applying, by the inkjet apparatus, a second ink on the first ink on the display panel,
wherein each of the first ink and the second ink includes an optically clear resin.

9. The coating method of claim 8, wherein the applying of the second ink on the first ink on the display panel includes applying the second ink on the first ink at an edge of the display panel.

10. The coating method of claim 9, wherein the first ink and the second ink are applied as a plurality of dots,
wherein a density of the plurality of dots at the edge of the display panel in a first direction and a density of the plurality of dots at the edge of the display panel in a second direction, perpendicular to the first direction, is the same.

11. The coating method of claim 8, wherein the rotating of the display panel to the substantially perpendicular position is performed after the applying of the first ink on the display panel.

12. The coating method of claim 8, wherein the first ink and the second ink include a same material.

13. The coating method of claim 8, wherein the first ink and the second ink are applied as a plurality of dots, wherein a density of the plurality of dots of the first ink is less than a density of the plurality of dots where the second ink is on the first ink.

14. The coating method of claim 8, further comprising:
curing, by a curing member, the first ink applied on the display panel after applying the first ink on the display panel through exposure to ultraviolet light; and
curing, by the curing member, the second ink applied on the display panel after applying the second ink on the display panel through exposure to ultraviolet light.

15. A coating method comprising:
providing a print object on a stage, wherein the print object is a display panel;
applying, by an inkjet apparatus comprising a plurality of first inkjet heads and a second inkjet head, a first ink on the display panel using the plurality of first inkjet heads;
rotating, by the stage, the display panel to a substantially perpendicular position; and
applying, by the inkjet apparatus using the second inkjet head, a second ink on the first ink on the display panel,
wherein each of the first ink and the second ink includes an optically clear resin.

16. The coating method of claim 15, wherein the applying of the second ink on the first ink on the display panel includes applying the second ink on the first ink at an edge of the display panel.

17. The coating method of claim 16, wherein the first ink and the second ink are applied as a plurality of dots, wherein a density of the plurality of dots at the edge of the display panel in a first direction and a density of the plurality of dots at the edge of the display panel in a second direction, perpendicular to the first direction, is the same.

18. The coating method of claim 15, wherein the rotating of the display panel to the substantially perpendicular position is performed after the applying of the first ink on the display panel.

19. The coating method of claim 15, wherein the first ink and the second ink are applied as a plurality of dots, wherein a density of the plurality of dots of the first ink is less than a density of the plurality of dots where the second ink is on the first ink.

20. The coating method of claim 15, further comprising:

curing, by a curing member, the first ink applied on the display panel after applying the first ink on the display panel through exposure to ultraviolet light; and curing, by the curing member, the second ink applied on the display panel after applying the second ink on the display panel through exposure to ultraviolet light.

\* \* \* \* \*